(12) United States Patent
Belopolsky et al.

(10) Patent No.: US 6,358,094 B1
(45) Date of Patent: Mar. 19, 2002

(54) LOW INDUCTANCE CONNECTOR WITH ENHANCED CAPACITIVELY COUPLED CONTACTS FOR POWER APPLICATIONS

(75) Inventors: Yakov Belopolsky, Harrisburg, PA (US); Jenn Tsao, Town Taoyuan (TW)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/538,698

(22) Filed: Mar. 30, 2000

Related U.S. Application Data

(60) Provisional application No. 60/154,159, filed on Sep. 15, 1999.

(51) Int. Cl.[7] .............................................. H01R 24/00
(52) U.S. Cl. ...................................................... 439/637
(58) Field of Search ................................ 439/607, 941, 439/637, 65, 631, 636, 79

(56) References Cited

U.S. PATENT DOCUMENTS

| | | | | |
|---|---|---|---|---|
| 3,239,798 A | * | 3/1966 | Silver ........................ 439/631 |
| 4,085,998 A | * | 4/1978 | Owens ....................... 439/856 |
| 4,577,922 A | * | 3/1986 | Stipanuk et al. ............ 439/629 |
| 4,806,110 A | * | 2/1989 | Lindeman ................... 439/108 |
| 4,878,862 A | * | 11/1989 | Wise ........................... 439/787 |
| 4,986,765 A | * | 1/1991 | Korsunsky et al. ......... 439/326 |
| 5,013,263 A | * | 5/1991 | Gordon et al. .............. 439/630 |
| 5,035,632 A | * | 7/1991 | Rudoy et al. ............... 439/108 |
| 5,094,623 A | * | 3/1992 | Scharf et al. ............... 439/101 |
| 5,098,306 A | * | 3/1992 | Noschese et al. ........... 439/188 |
| 5,156,554 A | * | 10/1992 | Rudoy et al. ............... 439/108 |
| 5,395,250 A | * | 3/1995 | Englert, Jr. et al. ........... 439/65 |
| 5,470,244 A | | 11/1995 | Lim et al. ................... 439/189 |
| 5,486,114 A | * | 1/1996 | Soes et al. ..................... 439/62 |
| 5,601,447 A | * | 2/1997 | Reed et al. .................. 439/404 |
| 5,629,839 A | | 5/1997 | Woychik ..................... 361/803 |
| 5,671,374 A | | 9/1997 | Postman et al. ............ 395/309 |
| 5,716,237 A | * | 2/1998 | Conorich et al. ........... 439/660 |
| 5,762,516 A | * | 6/1998 | Itoga et al. .................. 439/404 |
| 5,853,303 A | | 12/1998 | Brunker et al. ............. 439/637 |
| 5,864,478 A | | 1/1999 | McCutchan et al. ........ 363/147 |
| 5,873,739 A | | 2/1999 | Roberts ......................... 439/67 |
| 5,915,989 A | | 6/1999 | Adriaenssens et al. ..... 439/404 |
| 6,007,368 A | * | 12/1999 | Lorenz et al. .............. 439/418 |
| 6,062,872 A | * | 5/2000 | Strange et al. ................ 439/67 |
| 6,065,994 A | * | 5/2000 | Hashim et al. ............. 439/404 |
| 6,113,396 A | * | 9/2000 | Tung ............................. 439/62 |

FOREIGN PATENT DOCUMENTS

| | | |
|---|---|---|
| EP | 0 880 202 A2 | 11/1998 |
| GB | 2314467 A | 12/1997 |

* cited by examiner

*Primary Examiner*—Brian Sircus
*Assistant Examiner*—Son V. Nguyen
(74) *Attorney, Agent, or Firm*—Woodcock Washburn LLP

(57) ABSTRACT

A low inductance power connector for reducing inductance in an electrical conductor is provided. An interface connector connects circuit boards together while reducing inductance and increasing current carrying capacity. The connector for connecting circuit boards comprises a first contact having a body, a first mating portion and a second mating portion, and a second contact having a body, a third mating portion and a fourth mating portion. The first and second mating portions are substantially parallel and disposed on opposite sides of the body of the first contact, and the third and fourth mating portions are substantially parallel and disposed on opposite sides of the body of the second contact.

21 Claims, 8 Drawing Sheets

LOW INDUCTANCE CONNECTOR WITH ENHANCED CAPACITIVELY COUPLED CONTACTS FOR POWER APPLICATIONS

RELATED APPLICATION DATA

This application is related to Provisional U.S. Patent Application Ser. No. 60/154,159, which was filed on Sep. 15, 1999, herein incorporated by reference.

FIELD OF THE INVENTION

This invention generally relates to electrical connectors, and particularly, to a method and structure for reducing the inductance in electrical connectors while increasing the current carrying capacity.

BACKGROUND OF THE INVENTION

In today's high speed electronic equipment, it is desirable that the components of an interconnection path be optimized for signal transmission characteristics; otherwise, the integrity of the system will be impaired or degraded. Such characteristics include low inductance, increased current carrying capacity, suitable roll-off, and reduced ground bounce. Continuous efforts are made to develop electrical connectors that have as little effect on the system as possible.

Inductance is a concern in designing a connector. This is particularly true in electrical connectors for high speed electronic equipment. An example of one such connector is an edge card connector. An edge connector is provided for receiving a printed circuit board having a mating edge and contact pads adjacent the edge. Such edge connectors have an elongated housing defining an elongated receptacle or slot for receiving the mating edge of the printed circuit board. Terminals are spaced along one or both sides of the slot for engaging the contact pads adjacent the mating edge of the boards. In many applications, such edge connectors are mounted on a second printed circuit board. The mating edge board commonly is called the daughter board, and the board to which the connector is mounted is called the mother board. An inductive effect results from the interconnection of the printed circuit boards. Accordingly, it is desirable to reduce the inductive effects due to the interconnection of the printed circuit boards, and thus, there is a need for an interconnection system that reduces inductive effects between the boards being connected. Moreover, it is desirable to increase the current carrying capacity between the boards.

SUMMARY OF THE INVENTION

The present invention is directed to a low inductance power connector for reducing inductance in an electrical conductor. An interface connector connects circuit boards together while reducing inductance and increasing current carrying capacity.

A connector according to one embodiment of the invention comprises a first contact having a body, a first mating portion and a second mating portion substantially parallel to the first mating portion, the first and second mating portions disposed on opposite sides of the body of the first contact; and a second contact having a body, a third mating portion and a fourth mating portion substantially parallel to the third mating portion, the third and fourth mating portions disposed on opposite sides of the body of the second contact.

According to aspects of the invention, the first mating portion of the first contact and the third mating portion of the second contact are disposed on opposite sides of a plane so that the first mating portion and the third mating portion engage opposite sides of a circuit board, or the first mating portion of the first contact and the third mating portion of the second contact are coplanar so that the first mating portions and the third mating portion engage the same side of a circuit board.

According to further aspects of the invention, the second mating portion of the first contact and the fourth mating portion of the second contact are disposed on opposite sides of a plane so that the second mating portion and the fourth mating portion engage opposite sides of a circuit board, or the second mating portion of the first contact and the fourth mating portion of the second contact are coplanar so that the second mating portion and the fourth mating portion engage the same side of a circuit board.

An array connector according to another embodiment of the invention comprises a plurality of connectors, each connector comprising a body, a first contact having a first mating portion and a second mating portion substantially parallel to the first mating portion, the first and second mating portions disposed on opposite sides of the body of the first contact; and a second contact having a body, a third mating portion and a fourth mating portion substantially parallel to the third mating portion, the third and fourth mating portions disposed on opposite sides of the body of the second contact.

The foregoing and other aspects of the present invention will become apparent from the following detailed description of the invention when considered in conjunction with the accompanying drawings.

DESCRIPTION OF EXEMPLARY EMBODIMENTS AND BEST MODE

Figure 1:
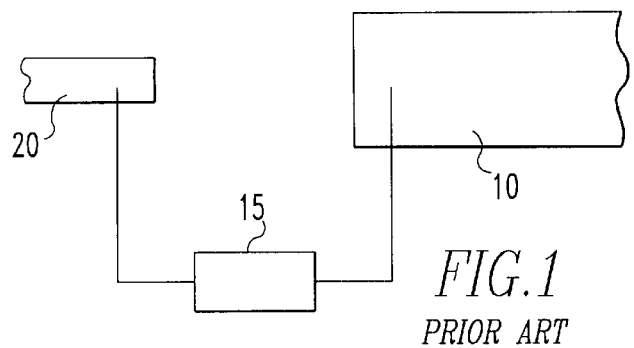
FIG. 1 shows a block diagram of a conventional interface connection between two circuit boards.

The present invention is directed to an interface connector 15 for connecting multiple circuit boards together. A typical circuit substrate such as a microprocessor board 10, shown in FIG. 1, can include traces or pads for, for example, cache, power, and return traces. It is desirable to connect the circuit board 10 to another circuit substrate such as a power board 20. Typically, the cache, the power, and the return traces connect to suitable conductive elements on board 20. It is desirable to reduce the inductance between the interconnection of the boards, while at the same time, increase the current carrying capacity. It is understood that the arrangement of cache, power, and return traces could be varied as desired by the circuit board designer.

Figure 2:
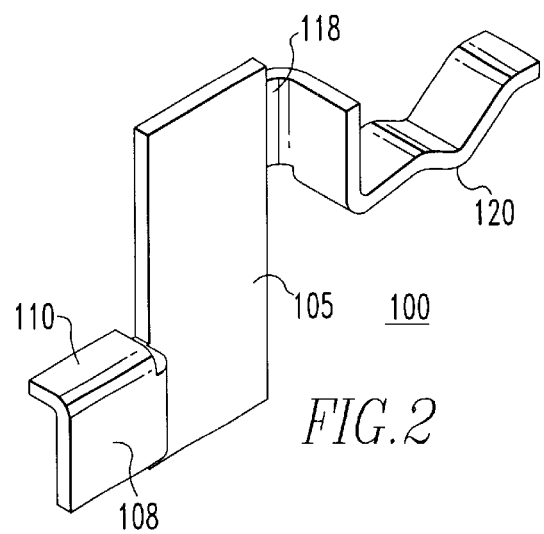
FIG. 2 is a perspective view of an exemplary contact in accordance with the present invention.
Figure 3:
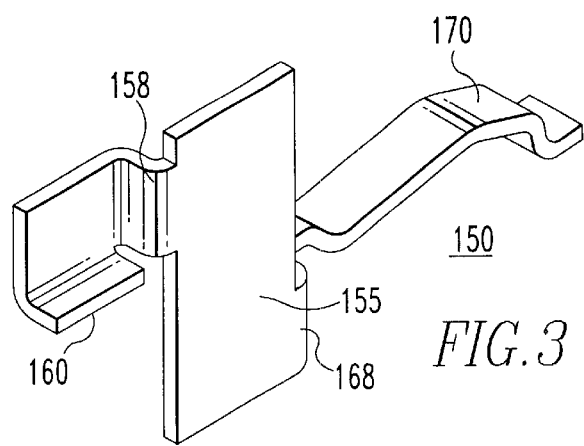
FIG. 3 is a perspective view of another exemplary contact in accordance with the present invention.

FIGS. 2 and 3 are perspective views of exemplary contacts 100, 150 in accordance with the present invention. The contact 100 comprises a body 105 and mating portions 110 and 120. As shown, the mating portions 110 and 120 are connected to the body of the contact 100 by tabs 108 and 118, respectively. As such, contact 100 can be stamped and formed from a suitable sheet of conductive material. The mating portions 110 and 120 are preferably substantially parallel to each other so that they can connect boards that are substantially parallel to each other.

The contact 150 shown in FIG. 3 is substantially similar to the contact shown in FIG. 2, except that it is oriented differently, more particularly, it is rotated upside down with respect to the contact shown in FIG. 2. The shape and design of the mating portions 120 and 170 can be substantially identical to each other, or can have variations, as shown, according to design preferences. Similarly, the shape and design of the mating portions 110 and 160 can be substantially identical to each other, or can have variations according to design preferences. The contact 150 comprises a body 155 and mating portions 160 and 170. As shown, the mating portions 160 and 170 are connected to the body of the contact 150 by tabs 158 and 168, respectively. Likewise, contact 150 can be stamped and formed. The mating portions 160 and 170 are preferably substantially parallel to each other so that they can connect boards that are substantially parallel to each other.

Figure 4:
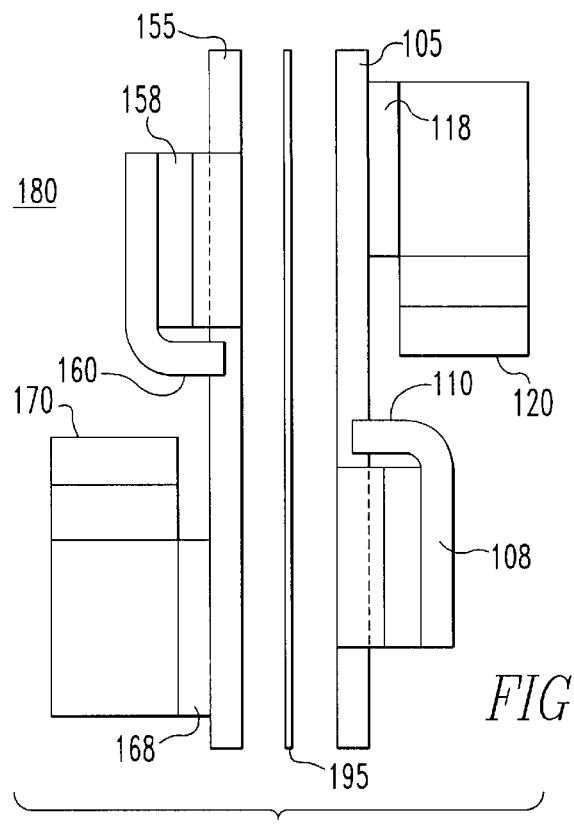
FIGS. 4 and 5 are front views of an exemplary connector, exploded and assembled, respectively, in accordance with the present invention.
Figure 5:
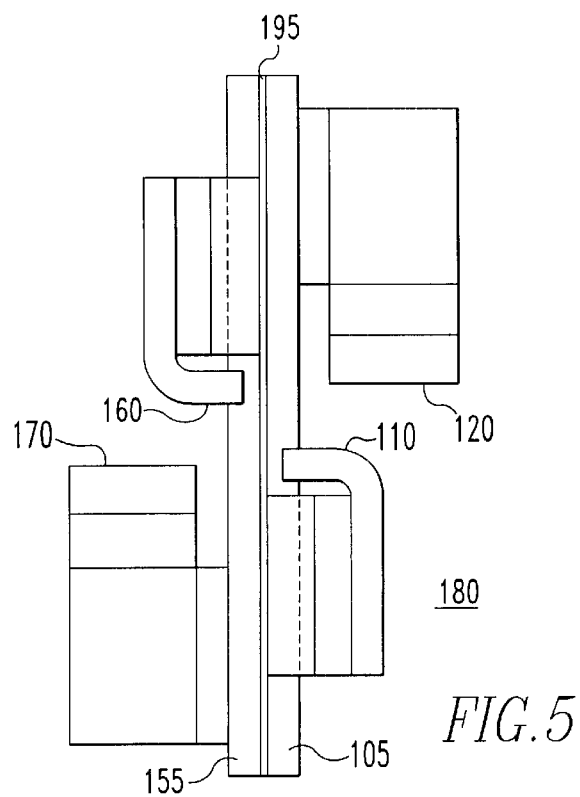

In accordance with a preferred embodiment, the contacts 100 and 150 can be paired together and used in a connector 300. FIGS. 4 and 5 show a front view of a contact pair 180, exploded and assembled, respectively. Preferably, the contacts 100 and 150 are separated by a dielectric material 195, such as Kapton, to prevent shorting and other interference.

Figure 6:
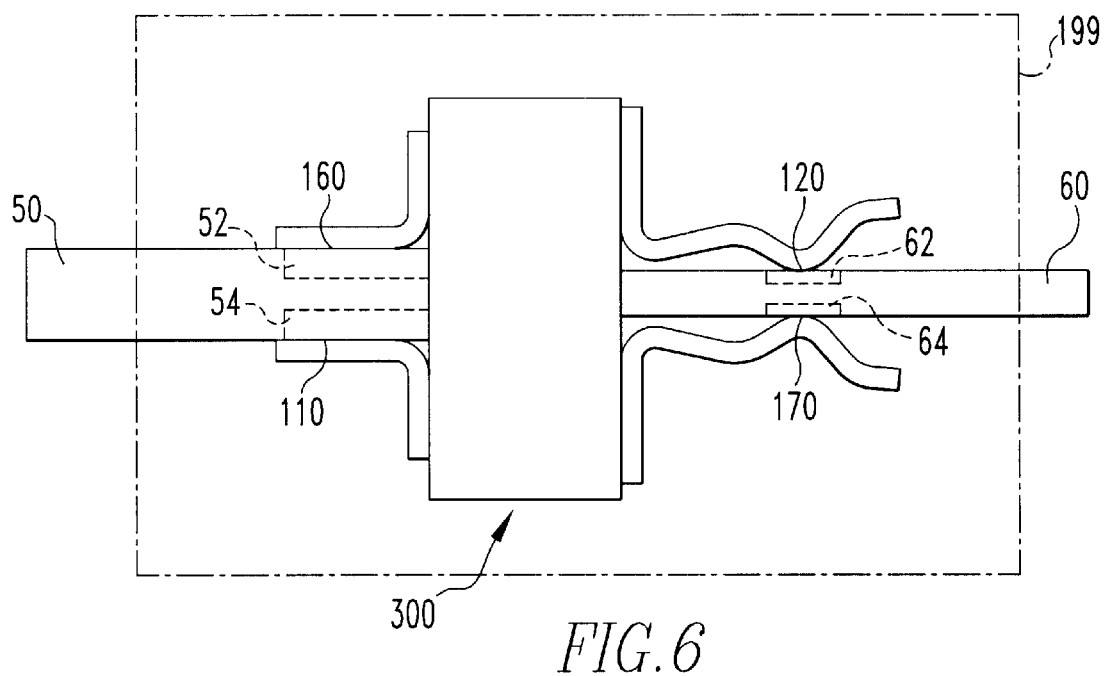
FIG. 6 is a side view of an exemplary connector comprising the contacts of FIGS. 2 and 3, engaging two circuit boards.

FIG. 6 is a side view of the connector 300, comprising the contacts 100 and 150 in a contact pair 180, engaging boards 50, 60. In FIG. 6, the mating portions 110 and 160 engage locations 54, 52, respectively, on opposite sides of a first board 50, such as a capacitive board, and the mating portions 120 and 170 engage traces or contact pads 62, 64 on opposite sides of a second board 60, such as a printed circuit board.

The medial portion of contacts 100, 150 extends generally transverse, preferably perpendicular, to boards 50, 60. Preferably, one end of contacts 100, 150 is fixed to board 50 using, for example, solder. The other end of contacts 100, 150 preferably removably receives the other board 60. The mating portions 110 and 160 can both engage a board on the same side of the board, or on opposite sides of the board. Similarly, the mating portions 120, 170 can both engage a board on the same side of the board, or on opposite sides of the board.

The contacts 100, 150, can be inserted into an optional plastic housing 199, although other methods of assembling the connector are possible, such as overmolding. In addition, suitable fasteners (not shown) can extend through openings in the medial portion of contacts 100, 150 to retain a series of contacts together (preferably separated by suitable dielectric material).

Figure 14:
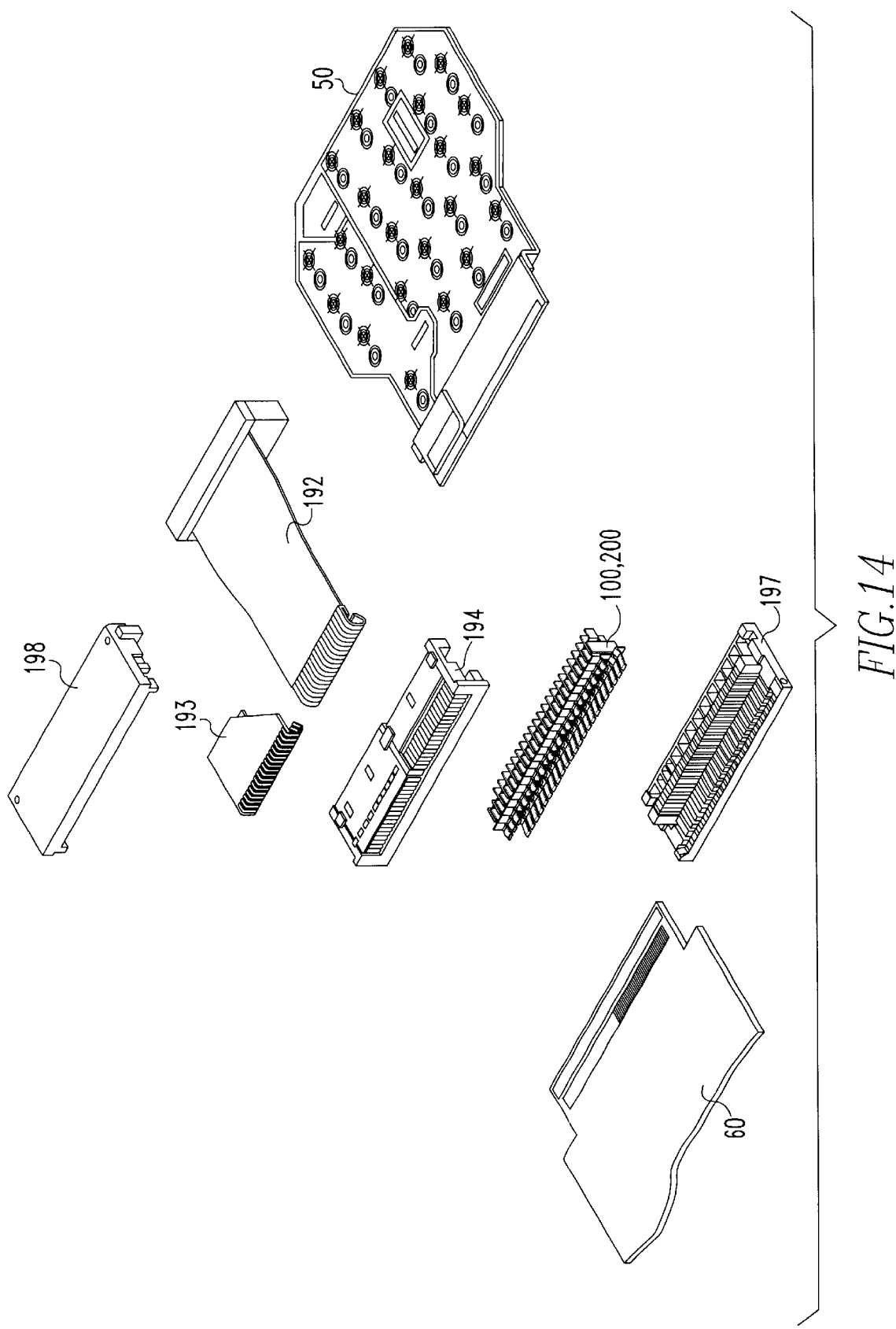
FIG. 14 is an exploded diagram of an exemplary array connector in accordance with the present invention.

Capacitance board 50, as seen in FIG. 14, can be a sandwich of conductive material, adhesive and a dielectric material. The outer surfaces are the conductive layers, such as copper. The conductive layers adhere to the medial dielectric layer. The conductive layers can have isolated sections to form, for example, the power, cache and return areas. The dielectric could be Kapton.

The second circuit board 60 has conductive elements such as traces or pads 62 and 64 inserted between the mating portions 120, 170 on the other end of the connector 300. In this manner, the location 52 of board 50 and trace 62 of board 60 are electrically connected, and the location 54 of board 50 and trace 64 of board 60 are electrically connected.

In the embodiment of FIG. 6, the mating portions 120, 170 engage the traces or pads 62, 64 on opposite sides of the board 60, and the mating portions 110, 160 engage the locations 52, 54 on opposite sides of the board 50. To interconnect additional pairs of traces, additional contacts (not shown) can be used. Mating portions 110, 120, 160, 170 could have any suitable termination to make an effective electrical connection between locations 52, 54, traces 62, 64 and contacts 100, 150. It is contemplated that the mating portions 110, 120, 160, 170 can be either straight, angled, or have any other suitable arrangement, depending on the circuit boards the connector 300 is to interconnect.

Figure 7:
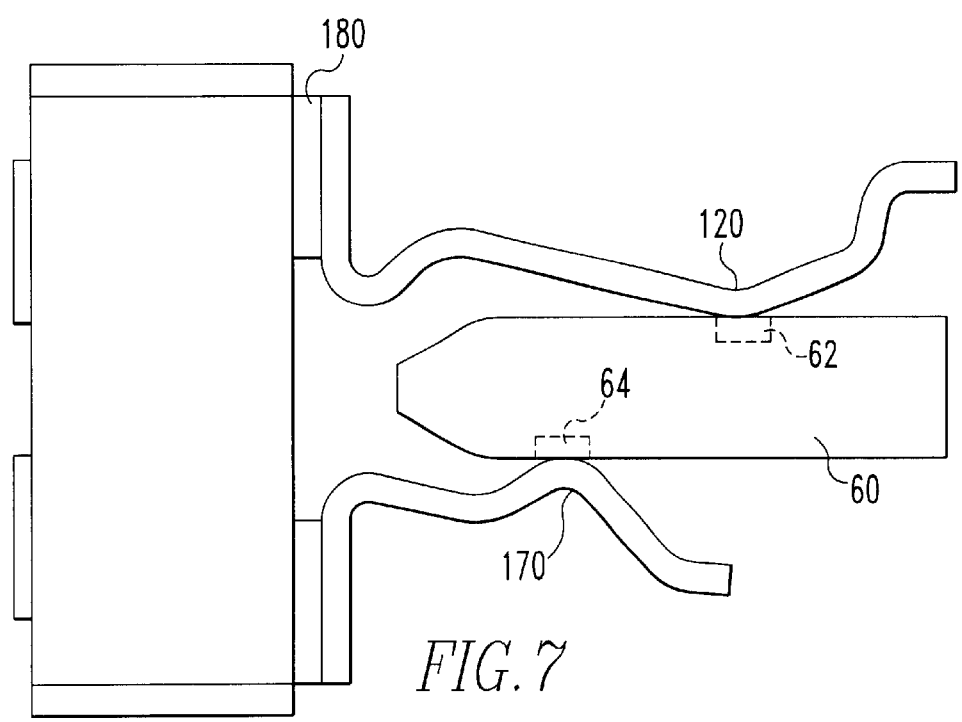
FIG. 7 is a detailed side view of an exemplary set of contacts of a connector in accordance with the present invention.
Figure 8:
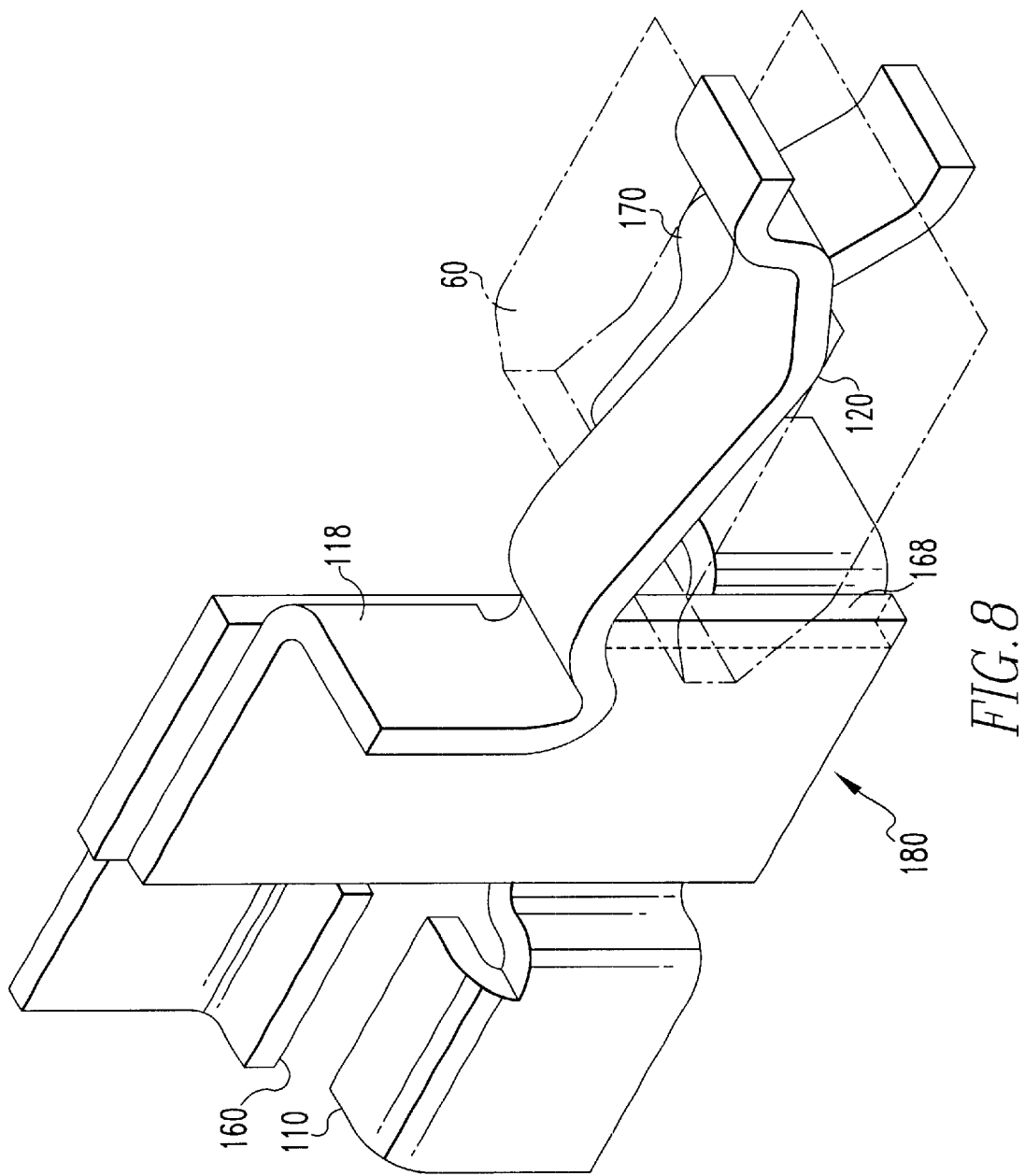
FIG. 8 is a perspective view of an exemplary connector in accordance with the present invention.
Figure 15:
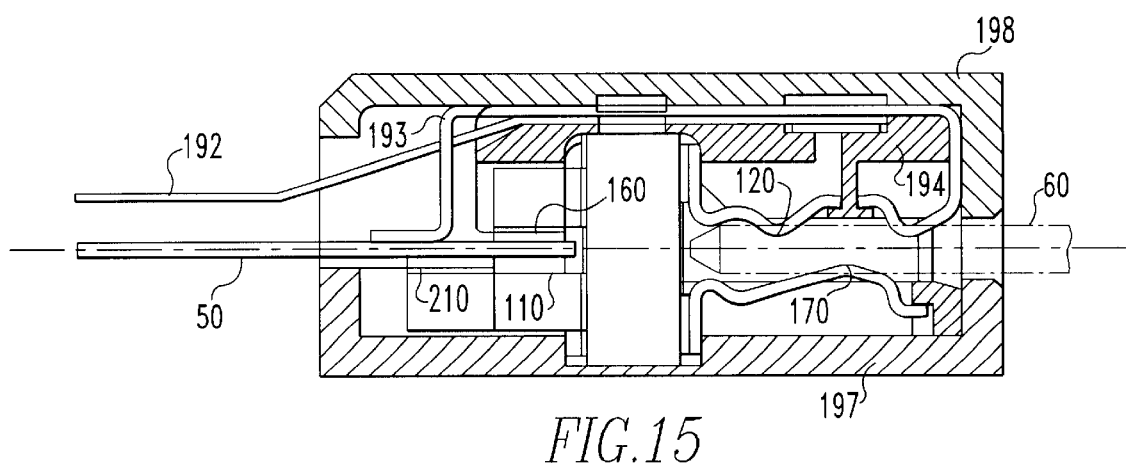
FIG. 15 is a cross-sectional side view of the array connector of FIG. 14, assembled.

FIG. 6 shows the mating portions 120 and 170 as being substantially the same distance offset from the body of the connector 300, so that the mating portions 120, 170 contact traces at the same position on the board 60, though on opposite surfaces of the board 60. However, it is contemplated that the mating portions 120 and 170 are laterally offset from each other, so that they can contact traces 62, 64 that are not only on opposite sides of the circuit board 60, but are at different lateral offsets on the board 60. FIG. 7 is a detailed side view of a portion of an exemplary set of contacts 100, 150 of a connector 300 in which the mating portions 120 and 170 are laterally offset from each other, as are the traces 62, 64, and FIG. 8 is a perspective view of the connector pair 180 in the connector 300. FIG. 15, described in further detail below, shows the mating portions 120 and 170 laterally offset, with portion 170 being further from the body of the connector 300 than portion 120.

Figure 9:
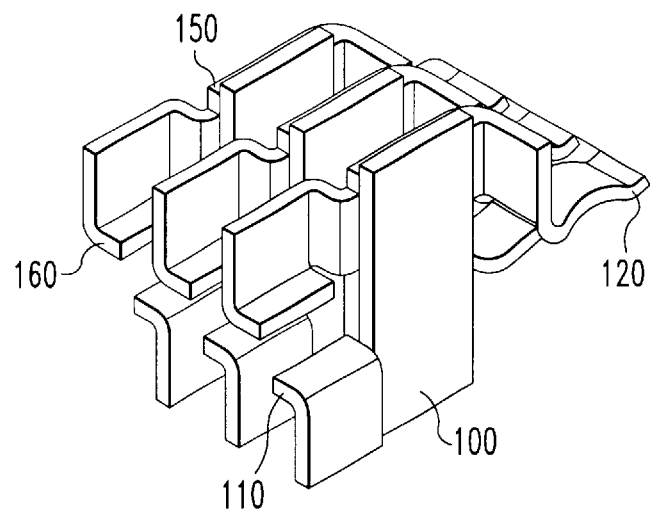
FIGS. 9 and 10 are perspective views of an array of the contacts shown in FIGS. 2 and 3.
Figure 10:
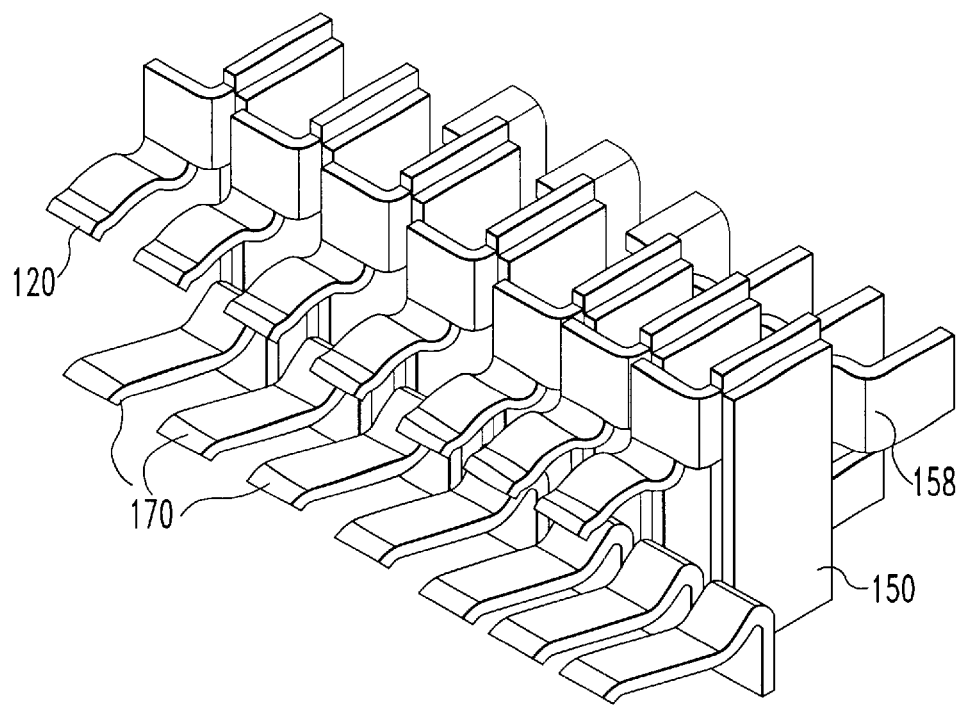

A plurality of the contact pairs 100, 150 can be arranged in an array within connector 300 to contact associated multiple traces or contact pads of circuit boards. FIGS. 9 and 10 are perspective views of an array of the contacts 100, 150, shown in FIGS. 2 and 3. In this manner, two circuit boards, each having rows of contacts on both surfaces, can be connected.

Figure 11:
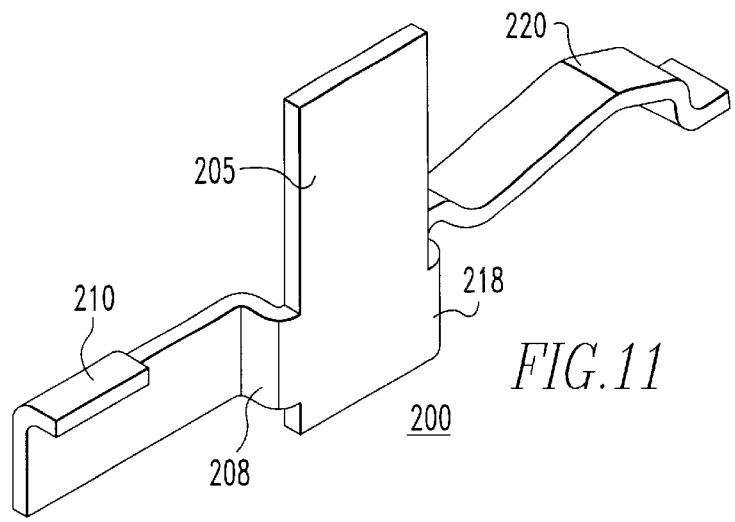
FIG. 11 is a perspective view of another exemplary contact in accordance with the present invention.

FIG. 11 is a perspective view of another exemplary contact 200 in accordance with the present invention. The contact 200 comprises a body 205 and mating portions 210 and 220. As shown, the mating portions 210 and 220 are connected to the body 205 of the contact 200 by tabs 208 and 218, respectively. The mating portions 210 and 220 are preferably substantially parallel to each other so that they can connect boards that are substantially parallel to each other.

The contact 200 can be paired with the contact 100 (FIG. 2) to form a connector for connecting two boards. In one embodiment, the mating portion 210 is parallel to, and coplanar with, the mating portion 110, but is displaced in distance. In this manner, the mating portions 110 and 210 can contact traces or contact pads on the same side of a circuit board (e.g., circuit board 50). In an exemplary connector, the mating portions 120 and 220 are disposed similar to the mating portions 120 and 170 of the connector 300. In this manner, the mating portions 120 and 220 can contact traces or contact pads on opposite sides of a circuit board.

Figure 12:
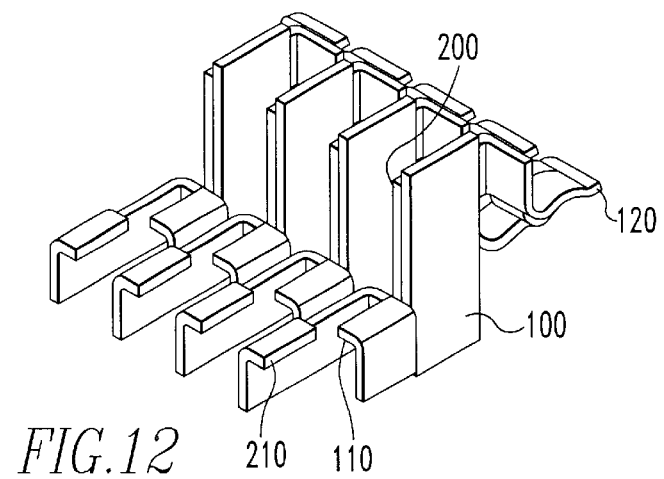
FIGS. 12 and 13 are perspective views of an array of the contacts shown in FIGS. 2 and 11.
Figure 13:
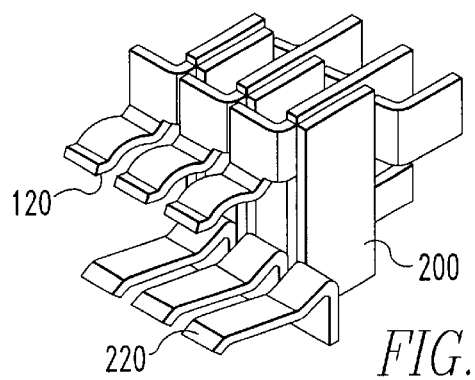

A plurality of contact pairs 100, 200 can be arranged in an array to contact associated multiple traces or contact pads of circuit boards. FIGS. 12 and 13 are perspective views of an array of the contacts 100, 200, shown in FIGS. 2 and 11, respectively.

FIG. 14 is an exploded diagram of an exemplary array connector in accordance with the present invention. A cross-sectional side view of the array connector of FIG. 14, assembled, is shown in FIG. 15. An array of contacts comprising, for example contacts 100, 150, and/or 200, for example, are positioned in a retainer 194 having openings corresponding to the mating portions of the contacts. Optional signal assemblies 192, 193 are disposed around the retainer 194 to contact additional pads or traces on the boards 50, 60.

The array connector is preferably disposed in a plastic housing comprising a base 197 and a cover 198. The housing surrounds the connector components 100, 150, 192, 193, 194 and receives the edges of the boards 50 and 60.

The contacts (e.g., 100, 150) provide capacitive coupling to generate a high capacitance between a source and a load. The high capacitance, in turn, leads to a desirable low ripple effect, thus increasing the reliability and performance of the connector.

The connector according to the present invention reduces the inductance between the boards, while at the same time, increases the current carrying capacity. By having the mating portions of a contact disposed substantially in parallel and facing in opposing directions, the current loop between the two boards being interconnected is shortened, thereby reducing the inductance between the boards. The current carrying capacity of the connector is increased because of the reduced cross-sectional area of the connector. The reduced cross-sectional area of the connector results from the arrangement of the contacts; namely, the mating portions of each contact are disposed substantially in parallel and facing in opposing directions.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A connector for connecting a first circuit board to a second circuit board, comprising:
   a first electrical contact having a first vertical body, a first mating portion horizontally extending from a bottom edge of a first L-shaped bend connected a top portion of the first body and a second mating portion laterally extending from a top edge of a second L-shaped bend connected a bottom portion of the first body and substantially parallel to the first mating portion, the first and second mating portions disposed on opposite sides of the first body; and
   a second electrical contact having a second vertical body, a third mating portion horizontally extending from a top edge of a third L-shaped bend connected to bottom portion of the second body and a fourth mating portion laterally extending from an edge of a fourth L-shaped bend connected to the second body and substantially parallel to to the third mating portion, the third and fourth mating portions disposed on opposite sides of the second body, and the first and third mating portions horizontally offset from each other in a direction of an insertion of one of the first circuit board and the second circuit board, wherein the first and second circuit boards are parallel to each other.

2. The connector according to claim 1, wherein the first and second mating portions face in opposing directions, and the third and fourth mating portions face in opposing directions.

3. The connector according to claim 1, wherein the first mating portion of the first contact and the third mating portion of the second contact are disposed on opposite sides of a plane so that the first mating portion and the third mating portion engage opposite sides of the one of the first circuit board and the second circuit board.

4. The connector according to claim 3, wherein the first and third mating portions face each other.

5. The connector according to claim 3, wherein the second mating portion of the first contact and the fourth mating portion of the second contact are disposed on opposite sides of a plane so that the second mating portion and the fourth mating portion engage opposite sides of the other of the first circuit board and the second circuit board.

6. The connector according to claim 3, wherein the second mating portion of the first contact and the fourth mating portion of the second contact are coplanar so that the second mating portion and the fourth mating portion engage the same side of one of the first circuit board and the second circuit board.

7. The connector according to claim 1, wherein the second mating portion of the first contact and the fourth mating portion of the second contact are coplanar so that the second mating portion and the fourth mating portion engage the same side of the other of the first circuit board and the second circuit board.

8. The connector according to claim 7, wherein the second mating portion of the first contact and the fourth mating portion of the second contact are disposed on opposite sides of a plane so that the second mating portion and the fourth mating portion engage opposite sides of the other of the first circuit board and the second circuit board.

9. The connector according to claim 1, wherein the first and second contacts are separated by a dielectric material.

10. The connector according to claim 1, in combination with a circuit substrate having conductive elements, the contacts secured to the conductive elements.

11. An array connector for connecting a first circuit board to a second circuit board, comprising:
    a plurality of connectors, each connecting comprising:
       a first electrical contact having a first vertical body, a first mating portion horizontally extending from a bottom edge of a first L-shaped bend connected a top portion of the first body and a second mating portion laterally extending from a top edge of a second L-shaped bend connected a bottom portion of the first body and substantially parallel to the first mating potion, the first and second mating portions disposed on opposite sides of the first body; and
       a second electrical contact having a second vertical body, a third mating portion horizontally extending from a top edge of a third L-shaped bend connected to bottom portion of the second body and a fourth mating portion laterally extending from an edge of a fourth L-shaped bend connected to the second body and portion substantially parallel to the third mating portion, the third and fourth mating portions disposed on opposite sides of the second body, and the first and third mating portions horizontally offset from each other in a direction of an insertion of one of the first circuit board and the second circuit board, wherein the first and second circuit boards are parallel to each other.

12. The connector according to claim 11, wherein the first and second mating portions of each first contact face in opposing directions, and the third and fourth mating portions of each second contact face in opposing directions.

13. The connector according to claim 11, wherein the first mating portion of each first contact and the third mating portion of each second contact are disposed on opposite sides of a plane so that the first and third mating portions engage opposite sides of the one of the first circuit board and the second circuit board.

14. The connector according to claim 13, wherein the first and third mating portions face each other.

15. The connector according to claim 13, wherein the second mating portion of each first contact and the fourth mating portion of each second contact are disposed on opposite sides of a plane so that the second and fourth mating portions engage opposite sides of the other of the first circuit board and the second circuit board.

16. The connector according to claim 13, wherein the second mating portion of each first contact and the fourth mating portion of each second contact are coplanar so that the second and fourth mating portions engage the same side of the other of the first circuit board and the second circuit board.

17. The connector according to claim 11, wherein the second mating portion of each first contact and the fourth mating portion of each second contact are coplanar so that the second and fourth mating portions engage the same side of one of the first circuit board and the second circuit board.

18. The connector according to claim 17, wherein the second mating portion of each first contact and the fourth mating portion of each second contact are disposed on opposite sides of a plane so that the second and fourth mating portions engage opposite sides of the other of the first circuit board and second circuit board.

19. The connector according to claim 11, wherein the first and second contacts of each of the plurality of connectors are separated by a dielectric material.

20. The connector according to claim 11, in combination with a circuit substrate having conductive elements, the contacts secured to the conductive elements.

21. The connector according to claim 11, further comprising a housing surrounding the plurality of connectors and having an opening for receiving the first and second circuit boards.

* * * * *

UNITED STATES PATENT AND TRADEMARK OFFICE
CERTIFICATE OF CORRECTION

PATENT NO.    : 6,358,094 B1                                   Page 1 of 1
DATED         : March 19, 2002
INVENTOR(S)   : Yakov Belopolsky et al.

It is certified that error appears in the above-identified patent and that said Letters Patent is hereby corrected as shown below:

Column 6,
Line 29, please delete "one" and insert -- the other --.

Signed and Sealed this

Fifth Day of November, 2002

Attest:

Attesting Officer

JAMES E. ROGAN
Director of the United States Patent and Trademark Office